United States Patent
Ohashi

(10) Patent No.: US 9,692,406 B2
(45) Date of Patent: Jun. 27, 2017

(54) POWER DEVICE DRIVE CIRCUIT

(71) Applicant: FUJI ELECTRIC CO., LTD., Kawasaki-shi (JP)

(72) Inventor: Hidetomo Ohashi, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/841,541

(22) Filed: Aug. 31, 2015

(65) Prior Publication Data
US 2015/0372672 A1 Dec. 24, 2015

(30) Foreign Application Priority Data
Apr. 8, 2013 (JP) .................................. 2013-080160

(51) Int. Cl.
| H03K 17/08 | (2006.01) |
| H03K 17/0812 | (2006.01) |
| H02M 1/08 | (2006.01) |
| H02M 7/538 | (2007.01) |

(52) U.S. Cl.
CPC ........ *H03K 17/08122* (2013.01); *H02M 1/08* (2013.01); *H03K 17/08128* (2013.01); *H02M 7/538* (2013.01); *H03K 2017/0806* (2013.01)

(58) Field of Classification Search
CPC ...... H03K 17/10; H03K 17/102; H03K 17/12; H03K 17/60; H03K 17/687; H03K 19/00361
USPC .......................... 327/108, 109, 110, 111, 112
See application file for complete search history.

(56) References Cited

U.S. PATENT DOCUMENTS

| 5,485,341 A | 1/1996 | Okado et al. |
| 5,689,460 A * | 11/1997 | Ooishi .................... G11C 5/143 327/530 |
| 7,307,390 B2 * | 12/2007 | Huynh .............. H02M 3/33507 315/209 R |
| 2005/0057238 A1* | 3/2005 | Yoshida ................ H02M 3/156 323/282 |
| 2012/0294105 A1* | 11/2012 | Seki ........................ G11O 5/147 365/226 |

FOREIGN PATENT DOCUMENTS

| CN | 101534110 A | 9/2009 |
| JP | H02-49388 U | 4/1990 |
| JP | H03-166816 A | 7/1991 |
| JP | H06-5221 U | 1/1994 |
| JP | H06-296363 A | 10/1994 |
| JP | H11-195971 A | 7/1999 |

* cited by examiner

*Primary Examiner* — John Poos
(74) *Attorney, Agent, or Firm* — Rabin & Berdo, P.C.

(57) ABSTRACT

A power device drive circuit reduces the short-circuit resistance of a power device that switches an input voltage. The power device drive circuit includes an output amplifier that applies a control voltage to a control terminal of the power device so as to be turned on and off, and an internal power supply circuit that generates a drive voltage of the output amplifier in accordance with a change in the input voltage, thereby causing the control voltage to change. In particular, the internal power supply circuit reduces the drive voltage of the output amplifier when the input voltage rises, thereby reducing the short-circuit current of the power device.

17 Claims, 10 Drawing Sheets

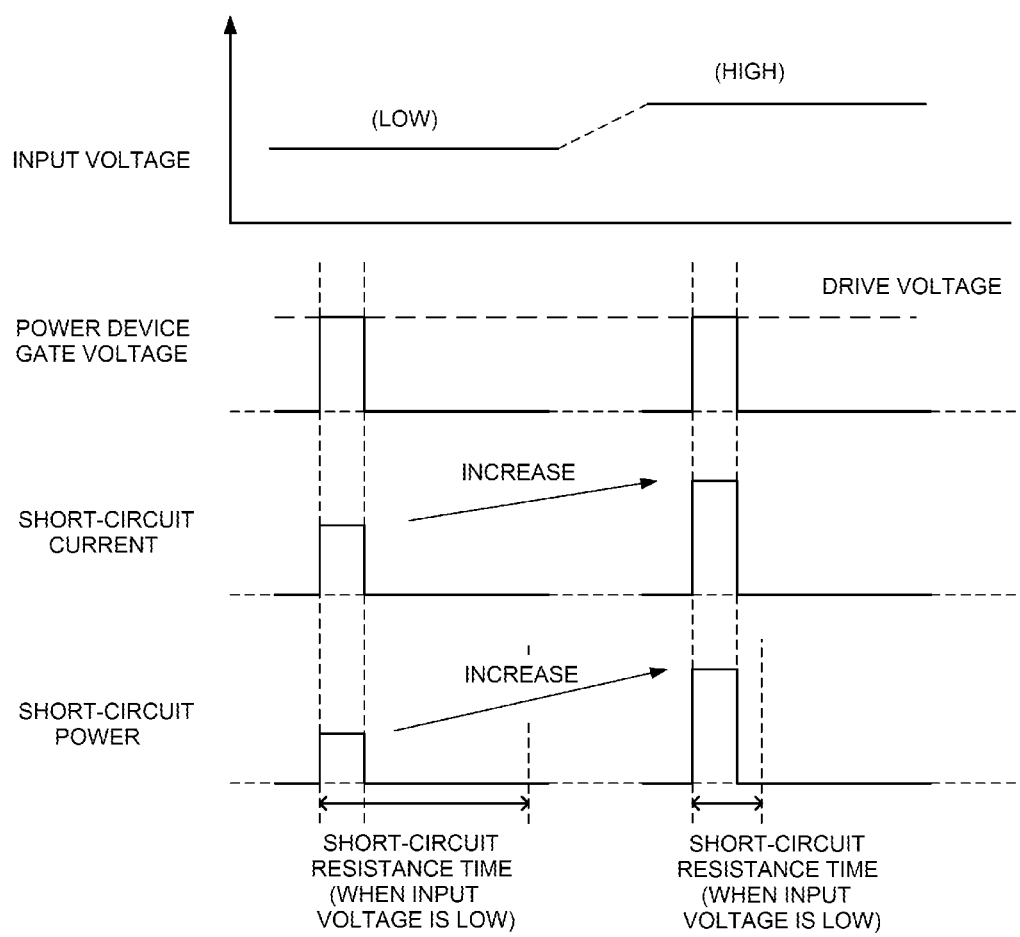

POWER DEVICE DRIVE CIRCUIT

CROSS-REFERENCE TO RELATED APPLICATIONS

This is a continuation of international application PCT/JP2014/056810, filed on Mar. 13, 2014 and designating the United States. Furthermore, this application claims the benefit of foreign priority of Japanese application 2013-080160, filed Apr. 8, 2013. The disclosures of these prior applications are incorporated herein by reference.

TECHNICAL FIELD

The present invention relates to a power device drive circuit suitable for driving a power device such as an IGBT or MOSFET used in an inverter or converter.

BACKGROUND ART

A power device such as an IGBT or MOSFET that switches input voltage is used in a power converter such as an inverter or converter. Specifically, the power converter includes power devices 1 and 2 formed of IGBTs of a totem pole connected bridge configuration, as shown in, for example, FIG. 8. Also, the power converter includes drive circuits 3 and 4, which apply control voltage to gates that are control terminals of the power devices 1 and 2, thereby driving the power devices 1 and 2 so as to be turned on and off in a complementary way.

Reference numbers 5 and 6 in the drawing identify freewheeling diodes connected in anti-parallel to the power devices 1 and 2 respectively. Also, 7 and 8 are output amplifiers that configure output stages of the drive circuits 3 and 4 respectively. Further, the power converter, by switching an input voltage Vin via the power devices 1 and 2, operates so that a predetermined output voltage Vout is obtained from a series connection point of the power devices 1 and 2.

Herein, it is undeniable that when the power devices 1 and 2 simultaneously carry out a turn-on operation for some reason, a large short-circuit current flows through the power devices 1 and 2. Therefore, there is a demand for the power devices 1 and 2 to be provided with a high short-circuit resistance in order to prevent thermal breakdown due to the short-circuit current. However, there is a problem in that, in order to increase short-circuit resistance, it is necessary to increase the chip size of the power devices 1 and 2, together with which the package size is also increased.

Therefore, excessive current flowing through the power devices 1 and 2 has thus far exclusively been detected using current detection means. Further, it has been proposed that overheating breakdown of the power devices 1 and 2 due to short-circuit current is prevented by stopping the drive of the power devices 1 and 2 by the drive circuits 3 and 4 when excessive current is detected (for example, refer to PTL 1 and 2).

CITATION LIST

Patent Literature

PTL 1: JP-A-6-296363
PTL 2: JP-A-11-195971

SUMMARY OF INVENTION

Technical Problem

However, existing drive circuits do not take fluctuation of the input voltage Vin into account. Therefore, existing technology is exclusively such that a predetermined drive power supply voltage VCC, which has a ground potential GND as a reference, is applied to the low side drive circuit 4 that drives the power device 2, thereby causing the drive circuit 4 to operate. Also, a predetermined drive power supply voltage VB, which has an intermediate potential VS at a series connection point of the power devices 1 and 2 as a reference, is applied to the high side drive circuit 3 that drives the power device 1, thereby causing the drive circuit 3 to operate.

Consequently, the drive power supply voltages (VCC-GND, VB-VS) applied to each of the drive circuits 3 and 4 are constantly kept constant, even when the input voltage Vin fluctuates as shown in, for example, FIG. 9, and the peak voltages applied to the power devices 1 and 2 change accordingly. Therefore, as shown in FIG. 10, the control voltage applied to the control terminals of the power devices 1 and 2, specifically the gates of the IGBTs, by the output amplifiers 7 and 8 is also constant, despite the change in the input voltage Vin. Therefore, a problem occurs in that when the power devices 1 and 2 simultaneously carry out a turn-on operation when the input voltage Vin is high, the short-circuit current increases in comparison with when the input voltage Vin is low, as shown in FIG. 10, and furthermore, the short-circuit power also increases. Consequently, when anticipating fluctuation in the input voltage Vin, it is necessary to allow for an increase in short-circuit power caused by a rise in the input voltage Vin, and set the short-circuit resistance of the power devices 1 and 2 on the high side inadvance.

The invention, having been contrived bearing this kind of situation in mind, has an object of providing a power device drive circuit with a simple configuration such that it is possible to effectively prevent overheating breakdown of a power device due to short-circuit current, without increasing the short-circuit resistance of the power device, even when input voltage is high.

Solution to Problem

In order to achieve the heretofore described object, a power device drive circuit according to the invention is suitable for driving a power device that switches input voltage, formed of, for example an IGBT or MOSFET, so as to be turned on and off, and is characterized by including an output amplifier that applies control voltage to a control terminal of the power device in accordance with an on/off control signal, thereby driving the power device so as to be turned on and off, and an internal power supply circuit that generates a drive power supply voltage of the output amplifier in accordance with a change in the input voltage, thereby causing the control voltage to change.

Preferably, the internal power supply circuit reduces the drive power supply voltage of the output amplifier when the input voltage rises, thereby reducing the control voltage, and reducing the short-circuit current of the power device.

Specifically, the internal power supply circuit is configured to include a comparator circuit that detects a rise in the input voltage, a holding circuit that holds the input voltage when a rise in the input voltage is detected by the comparator circuit, and an inversion amplification circuit that generates the drive power supply voltage of the output amplifier in accordance with the voltage held by the holding circuit.

The internal power supply circuit may further include a polarity detector that determines the polarity of a change in the input voltage, and a voltage holding control circuit that reduces the voltage held by the holding circuit in accordance with the output of the polarity detector.

Herein, the input voltage is voltage that is rectified alternating current voltage, and the voltage holding control circuit is configured so as to reduce the voltage held by the holding circuit when the peak voltage of the input voltage decreases a predetermined consecutive number of times.

Advantageous Effects of Invention

According to the power device drive circuit according to the invention, when the input voltage applied to a power device increases, the drive power supply voltage to the output amplifier is reduced in accordance with the change in the input voltage. Then, in response to this, the control voltage applied to the control terminal of the power device by the output amplifier decreases. As a result of this, even when short-circuit current flows through the power device, it is possible to keep the short-circuit current itself small, because of which it is possible to restrict the short-circuit power of the power device.

Consequently, it is not necessary to allow for an increase in short-circuit power caused by a rise in the input voltage, and set the short-circuit resistance of the power device on the high side inadvance, as has been the case to date. Therefore, according to the drive circuit according to the invention, it is possible to stably drive a power device including the minimum necessary short-circuit resistance, and possible to forestall overheating breakdown of the power device due to short-circuit current. Moreover, the drive circuit configuration is simple in that it includes the internal power supply circuit that causes the drive power supply voltage to the output amplifier to change in accordance with a change in the input voltage. Consequently, advantages are achieved in that there is no further complication of the configuration of the drive circuit itself, and the like.

BRIEF DESCRIPTION OF DRAWINGS

FIG. 10 is a diagram schematically showing aspects of change in the short-circuit current and short-circuit power in a power device when the input voltage Vin increases in the existing power converter.

DESCRIPTION OF EMBODIMENTS

Figure 1:
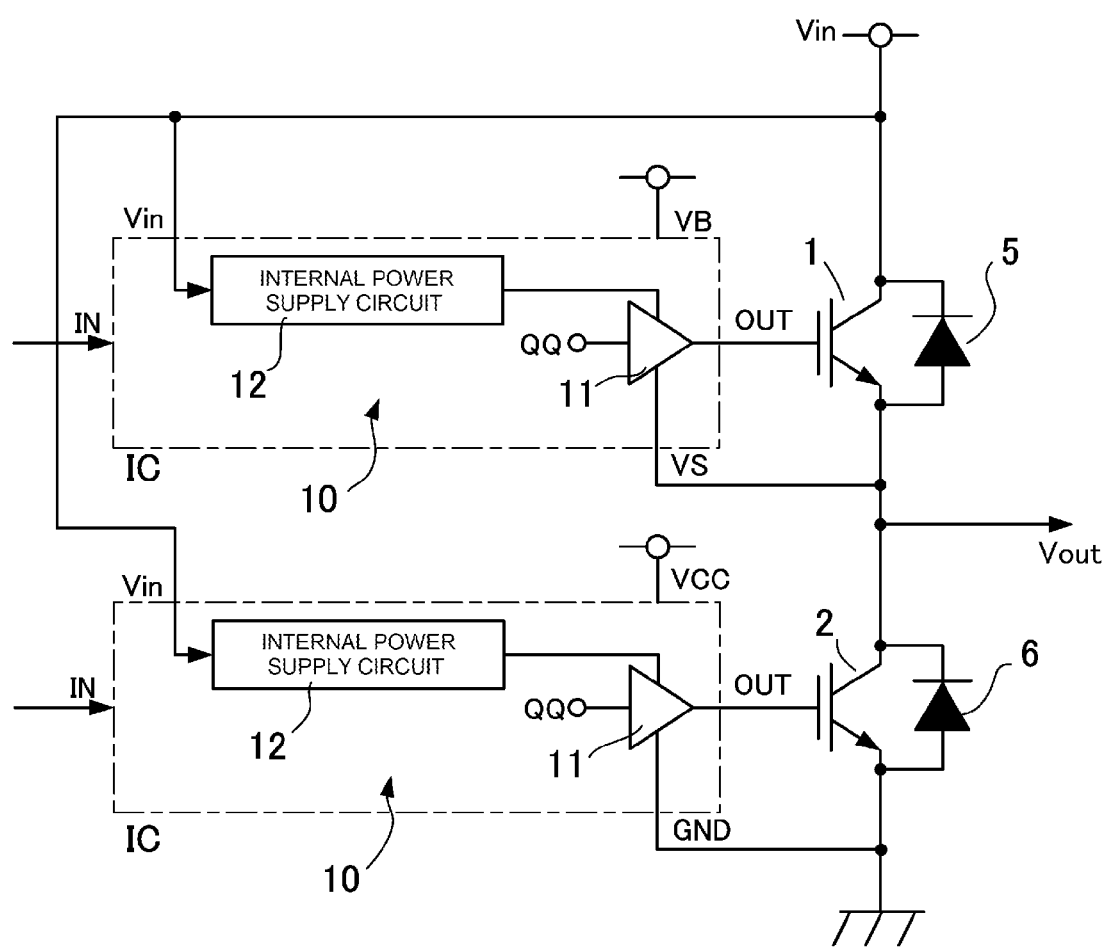
FIG. 1 is a main portion outline configuration diagram of a power converter configured using a drive circuit according to the invention.

Hereafter, referring to the drawings, a description will be given of a power device drive circuit according to embodiments of the invention.

Figure 8:
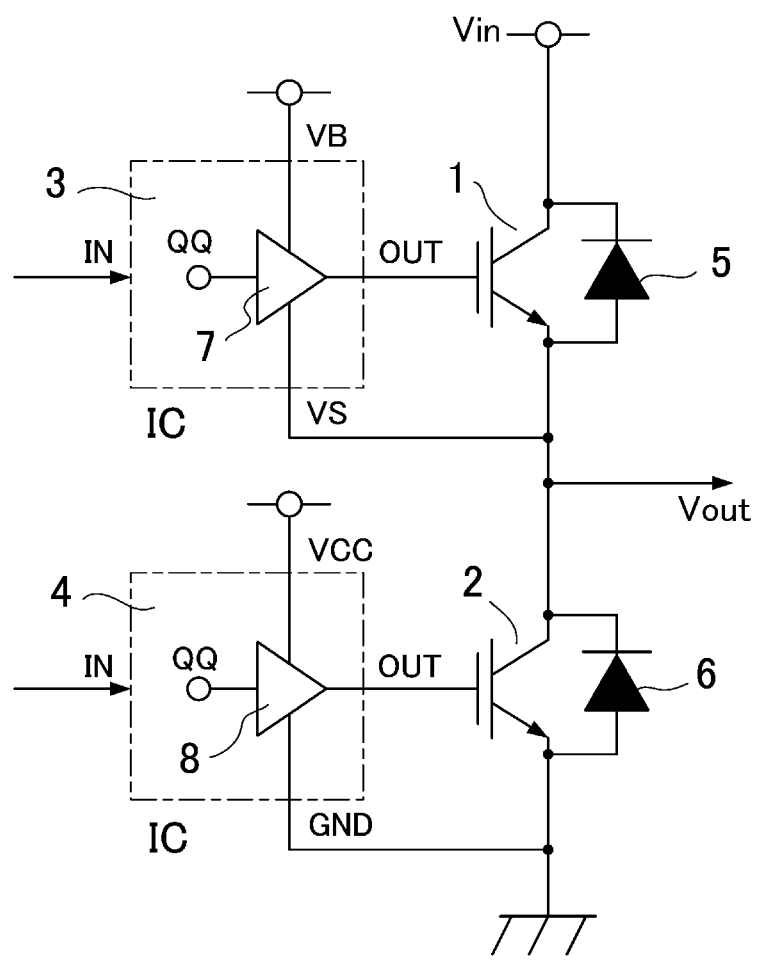
FIG. 8 is a main portion outline configuration diagram of an existing general power converter.
Figure 9:
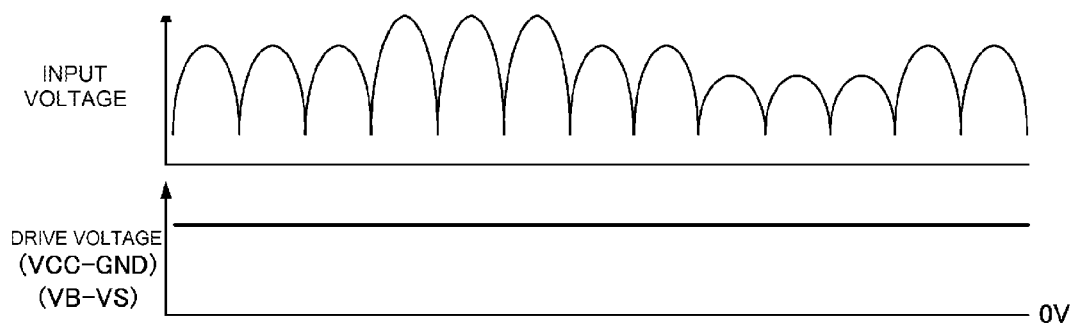
FIG. 9 is a diagram showing a relationship between input voltage and drive circuit drive power supply voltage.

FIG. 1 is a main portion outline configuration diagram of a power converter configured using a drive circuit 10 according to the invention, wherein portions the same as in the power converter shown in FIG. 8 are shown with the same reference signs. This power converter uses the drive circuit 10 according to the invention in place of the previously described existing drive circuits 3 and 4. Further, the predetermined drive power supply voltage VB, which has the intermediate potential VS at a series connection point of the power devices 1 and 2 as a reference, is applied to the high side drive circuit 10, which drives the power device 1 so as to be turned on and off, thereby causing the drive circuit 10 to operate. Also, the configuration is such that the predetermined drive power supply voltage VCC, which has the ground potential GND as a reference, is applied to the low side drive circuit 10, which drives the power device 2 so as to be turned on and off, thereby causing the drive circuit 10 to operate.

Herein, as shown in the outline configuration thereof in FIG. 1, the drive circuit 10 includes in an output stage thereof an output amplifier 11, which applies control voltage to the control terminals of the power devices 1 and 2 in accordance with an on/off control signal, thereby driving the power devices 1 and 2 so as to be turned on and off. Furthermore, the drive circuit 10 includes an internal power supply circuit 12 that generates a drive power supply voltage VA of the output amplifier 11 in accordance with a change in the input voltage Vin. In particular, when the input voltage Vin rises, the internal power supply circuit 12 performs a role of reducing the control voltage output by the output amplifier 11 by reducing the drive power supply voltage VA in accordance with the rise in the input voltage Vin.

Figure 2:
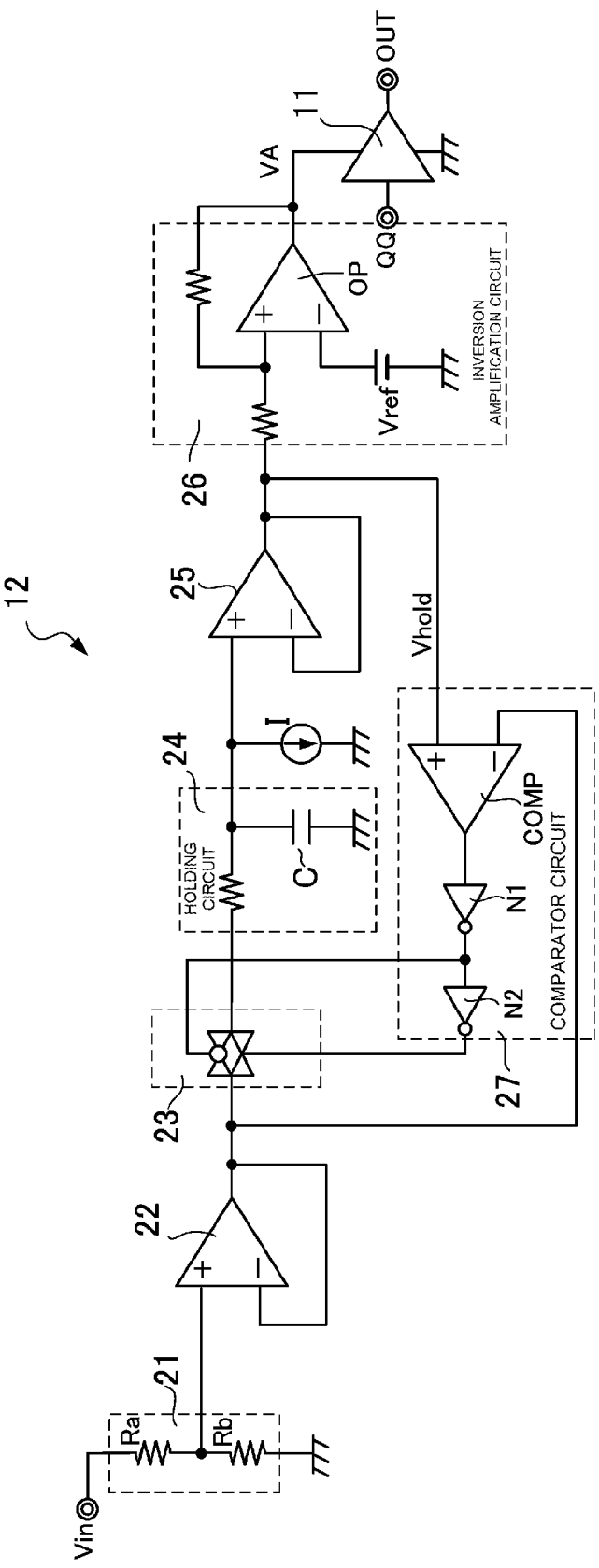
FIG. 2 is a main portion outline configuration diagram of the drive circuit according to a first embodiment of the invention.

FIG. 2 is a main portion outline configuration diagram of the drive circuit 10 according to a first embodiment of the invention, and shows a specific configuration example of the output amplifier 11 and the internal power supply circuit 12 that generates the drive power supply voltage VA of the output amplifier 11.

The internal power supply circuit 12 includes voltage detection means 21, formed of voltage dividing resistors Ra and Rb, for detecting the input voltage Vin applied to the power devices 1 and 2, and an input buffer amplifier 22 into which is input the voltage detected by the voltage detection means 21. The voltage detected via the input buffer amplifier 22 is provided via an analog switch 23 to a holding circuit 24, and held by a capacitor C of the holding circuit 24. Further, the voltage held by the capacitor C of the holding circuit 24 is provided via an output buffer amplifier 25 to an inversion amplification circuit 26.

The inversion amplification circuit 26 performs a role as voltage regulation means that generates the drive power supply voltage VA of the output amplifier 11 in accordance with the voltage held by the capacitor C of the holding circuit 24. Specifically, the inversion amplification circuit 26 includes an inverting amplifier OP that, operating with a preset reference voltage Vref as a base, generates the drive power supply voltage VA. Further, the inverting amplifier OP in the inversion amplification circuit 26 reduces the drive power supply voltage VA when the voltage held by the capacitor C of the holding circuit 24 becomes higher than the reference voltage Vref. Contrarily, the inverting amplifier OP raises the drive power supply voltage VA when the voltage held by the capacitor C of the holding circuit 24 becomes lower than the reference voltage Vref.

Herein, when giving a specific description of the internal power supply circuit 12, detected voltage corresponding to the input voltage Vin detected by the voltage detection means 21 will hereafter equivalently be called the input voltage Vin. Control of voltage holding by the holding circuit 24 is carried out by a comparator circuit 27 that turns the analog switch 23 on and off. The comparator circuit 27 is configured based on a comparator COMP that compares the input voltage Vin detected via the input buffer amplifier 22 and a holding voltage Vhold held by the holding circuit 24 and obtained via the output buffer amplifier 25. Further, when the input voltage Vin exceeds the holding voltage Vhold, the comparator COMP drives the analog switch 23 so as to be turned on via two stages of NOT circuit N1 and N2 connected in series. By the analog switch 23 carrying out a turn-on operation, the input voltage Vin is sampled, and held by the capacitor C of the holding circuit 24.

A predetermined constant current supply I is connected in parallel to the capacitor C in the holding circuit 24. The constant current supply I performs a role of gradually reducing the holding voltage Vhold to follow a drop in the input voltage Vin by discharging the stored charge of the capacitor C at a speed sufficiently slower than the fluctuation speed of the input voltage Vin. It is also possible to connect a discharge resistor in parallel with the capacitor C instead of the constant current supply I.

Figure 3:
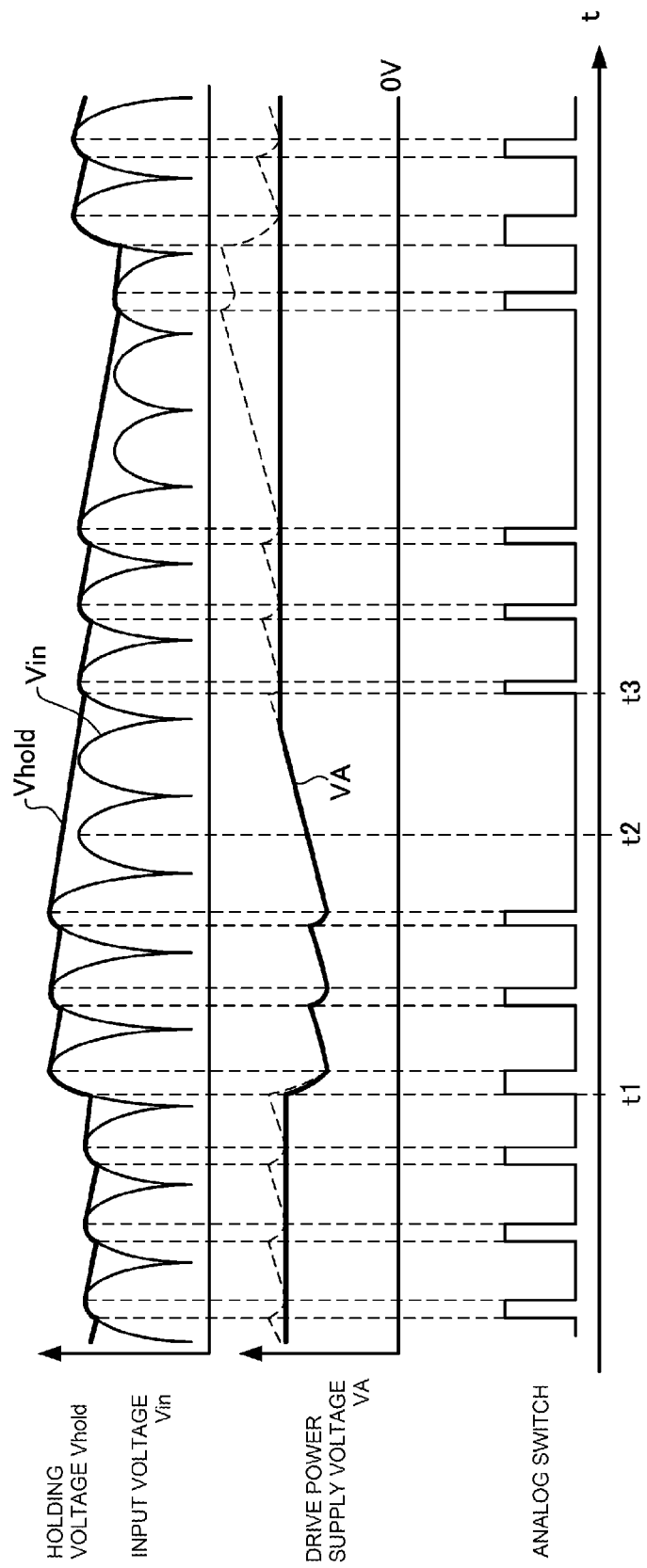
FIG. 3 is a diagram schematically showing an aspect of change in the drive power supply voltage VA with respect to change in input voltage Vin in an internal power supply circuit of the drive circuit shown in FIG. 2.

FIG. 3 schematically shows an aspect of change in the drive power supply voltage VA with respect to change in the input voltage Vin in the internal power supply circuit 12 with the heretofore described configuration. When alternating current voltage is rectified and the input voltage Vin applied to the totem pole connected power devices 1 and 2 changes, the analog switch 23 is driven so as to be turned on every time the peak voltage of the input voltage Vin exceeds the holding voltage Vhold, as shown in FIG. 3. Further, the peak voltage of the input voltage Vin is held via the analog switch 23 by the holding circuit 24.

When the input voltage Vin increases sharply, as shown at a timing t1 in FIG. 3, the drive power supply voltage VA output by the inversion amplification circuit 26 decreases in response to the rise of the holding voltage Vhold holding the input voltage Vin. The amount by which the drive power supply voltage VA decreases is determined in accordance with the deviation of the holding voltage Vhold with respect to the previously described reference voltage Vref. Also, even when the input voltage Vin decreases, as shown at a timing t2, the analog switch 23 is not driven so as to be turned on when the input voltage Vin exceeds the holding voltage Vhold. Consequently, in this case, the holding voltage Vhold is gradually reduced by the constant current supply I. Thereupon, the drive power supply voltage VA output by the inversion amplification circuit 26 gradually increases in response to the gradual reduction of the holding voltage Vhold.

Further, when the input voltage Vin exceeds the holding voltage Vhold, the analog switch 23 is driven so as to be turned on again, and the input voltage Vin is held by the holding circuit 24. When the holding voltage Vhold drops below the reference voltage Vref, the inversion amplification circuit 26, theoretically, operates so as to increase the drive power supply voltage VA, as shown by a broken line in FIG. 3. However, as the maximum value of the drive power supply voltage VA, which is the output voltage of the inversion amplification circuit 26, is restricted by a constant drive power supply voltage (VCC-GND, VB-VS) applied to the inverting amplifier OP of the inversion amplification circuit 26, the drive power supply voltage VA does not rise to or above a pre-specified maximum output voltage.

Consequently, according to the drive circuit 10 according to the invention, as the drive circuit 10 includes the internal power supply circuit 12 that changes the drive power supply voltage VA to the output amplifier 11 in accordance with change in the input voltage Vin, as heretofore described, it is possible to reduce the drive power supply voltage VA when the input voltage Vin increases. Thereupon, the control voltage output by the output amplifier 11 decreases beyond that at a time of normal operation in response to the decrease in the drive power supply voltage VA. Consequently, when the input voltage Vin increases, control voltage lower than that at a time of normal operation is applied to the control terminals of the power devices 1 and 2.

As a result of this, even when there is a situation wherein short-circuit current flows through the power devices 1 and 2 in a state in which input voltage Vin higher than that at a normal time is being applied, the control voltage to be applied to the power devices 1 and 2 is set low, as previously described, because of which it is possible to keep the short-circuit current commensurately small. Consequently, the short-circuit power indicated by the product of the input voltage Vin and short-circuit current can be reduced in comparison with when driving using the existing drive circuits 3 and 4. Therefore, the short-circuit resistance required of the power devices 1 and 2 can be set low.

Figure 4:
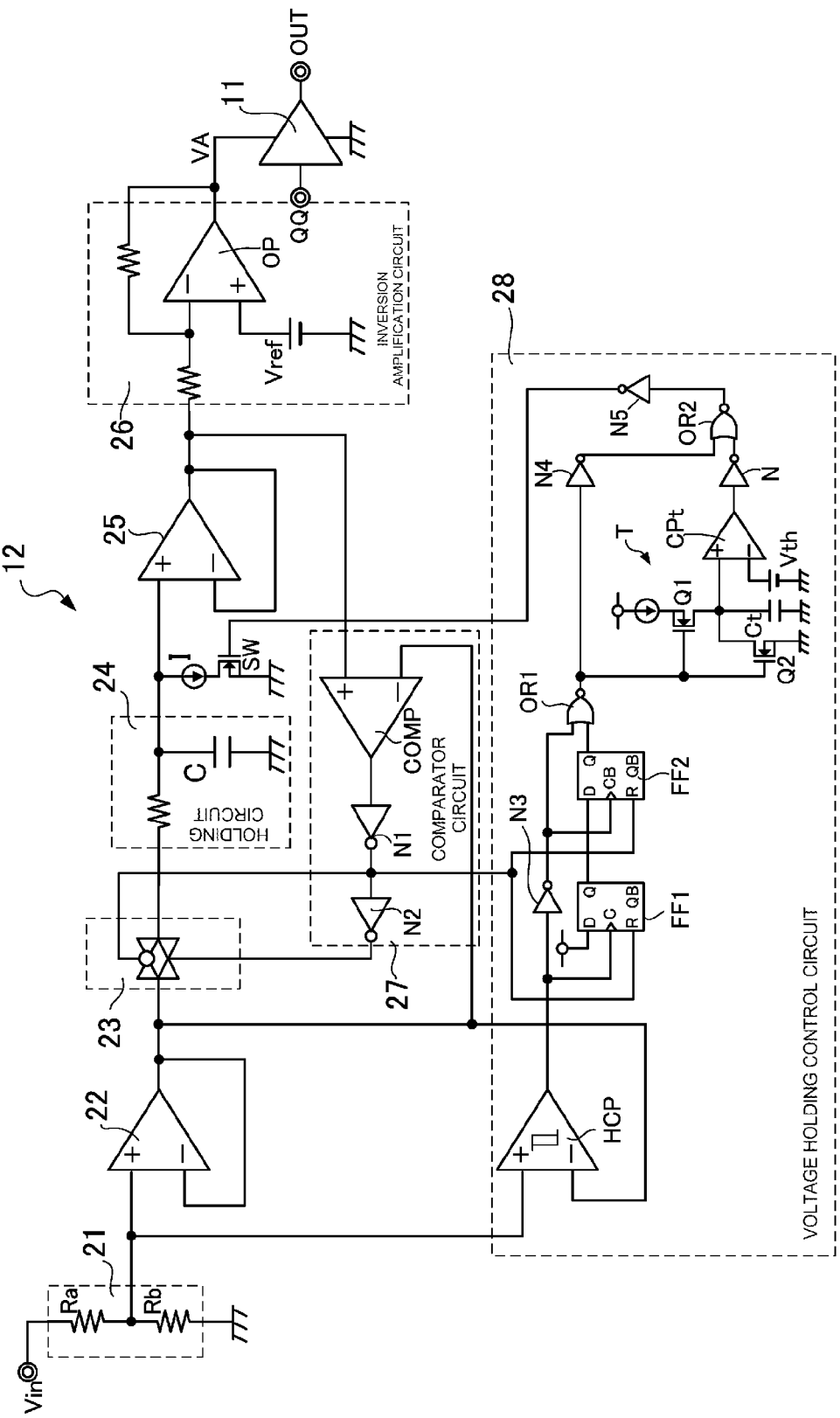
FIG. 4 is a main portion outline configuration diagram of the drive circuit according to a second embodiment of the invention.

FIG. 4 is a main portion outline configuration diagram of the drive circuit 10 according to a second embodiment of the invention, and shows a specific configuration example of the output amplifier 11 and the internal power supply circuit 12 that generates the drive power supply voltage VA of the output amplifier 11. The same reference signs are given to portions the same as portions of the drive circuit 10 shown in FIG. 2, and redundant repetition of descriptions will be omitted.

The internal power supply circuit 12 is characterized by including a switch element SW that controls discharge of the capacitor C in the holding circuit 24, and by including a voltage holding control circuit 28 that controls the turning on and off of the switch element SW, in addition to the configuration of the internal power supply circuit 12 according to the first embodiment shown in FIG. 2. The switch element SW is formed of, for example, a MOSFET. Further, the voltage holding control circuit 28 performs a role of reducing the holding voltage Vhold held by the holding circuit 24 by determining the polarity of a change in the input voltage Vin, and driving the switch element SW so as to be turned on.

That is, the voltage holding control circuit 28 includes as a polarity detector a hysteresis comparator HCP that determines the polarity of a change in the input voltage Vin by comparing the input voltage of the input buffer amplifier 22, which is the output voltage of the voltage detection means 21, and the output voltage of the input buffer amplifier 22. The hysteresis comparator HCP determines whether the input voltage Vin is rising (a positive change) or decreasing (a negative change) by comparing slight potential differences of the input voltage Vin occurring due to a transmission delay of the input buffer amplifier 22. Further, the hysteresis comparator HCP inverts the output thereof to the "H" level when the input voltage Vin is decreasing, as shown by the operation waveform of the hysteresis comparator HCP in FIG. 5.

Furthermore, the voltage holding control circuit 28 includes two stages of flip-flop FF1 and FF2 provided at a stage subsequent to the hysteresis comparator HCP. The first stage flip-flip FF1 receives the output of the hysteresis comparator HCP, and carries out a latching operation. Also, the second stage flip-flip FF2 receives the output of the hysteresis comparator HCP inverted via a first NOT circuit N3, and carries out a latching operation.

Consequently, the first stage flip-flip FF1 takes in the power supply voltage and is set to the "H" level when the hysteresis comparator HCP detects a decrease in the input voltage Vin. Further, the second stage flip-flip FF2 takes in a set output Q of the first stage flip-flip FF1, and carries out an inversion operation, when the hysteresis comparator HCP detects a rise in the input voltage Vin.

Herein, each of the flip-flops FF1 and FF2 is reset by receiving the output of the comparator circuit 27. Specifically, each of the flip-flops FF1 and FF2 is reset by the output of the comparator COMP, which is inverted when the input voltage Vin equals or exceeds the holding voltage Vhold, being input via the NOT circuit N1. The analog switch 23 simultaneously takes in the output of the NOT circuit N1 and the output of the NOT circuit N2, and carries out a turn-on operation, when the output of the comparator COMP continues at the "L" level for a predetermined time.

That is, in a state wherein the peak voltage of the input voltage Vin and the holding voltage Vhold are momentarily equal, the comparator COMP simply momentarily inverts the output thereof. Therefore, it does not happen under this kind of condition that the analog switch 23 carries out a turn-on operation due to a delay in the operation of the NOT circuit N2 and analog switch 23. However, the flip-flops FF1 and FF2 are reset in synchronization with the inversion of the output of the comparator COMP.

Figure 5:
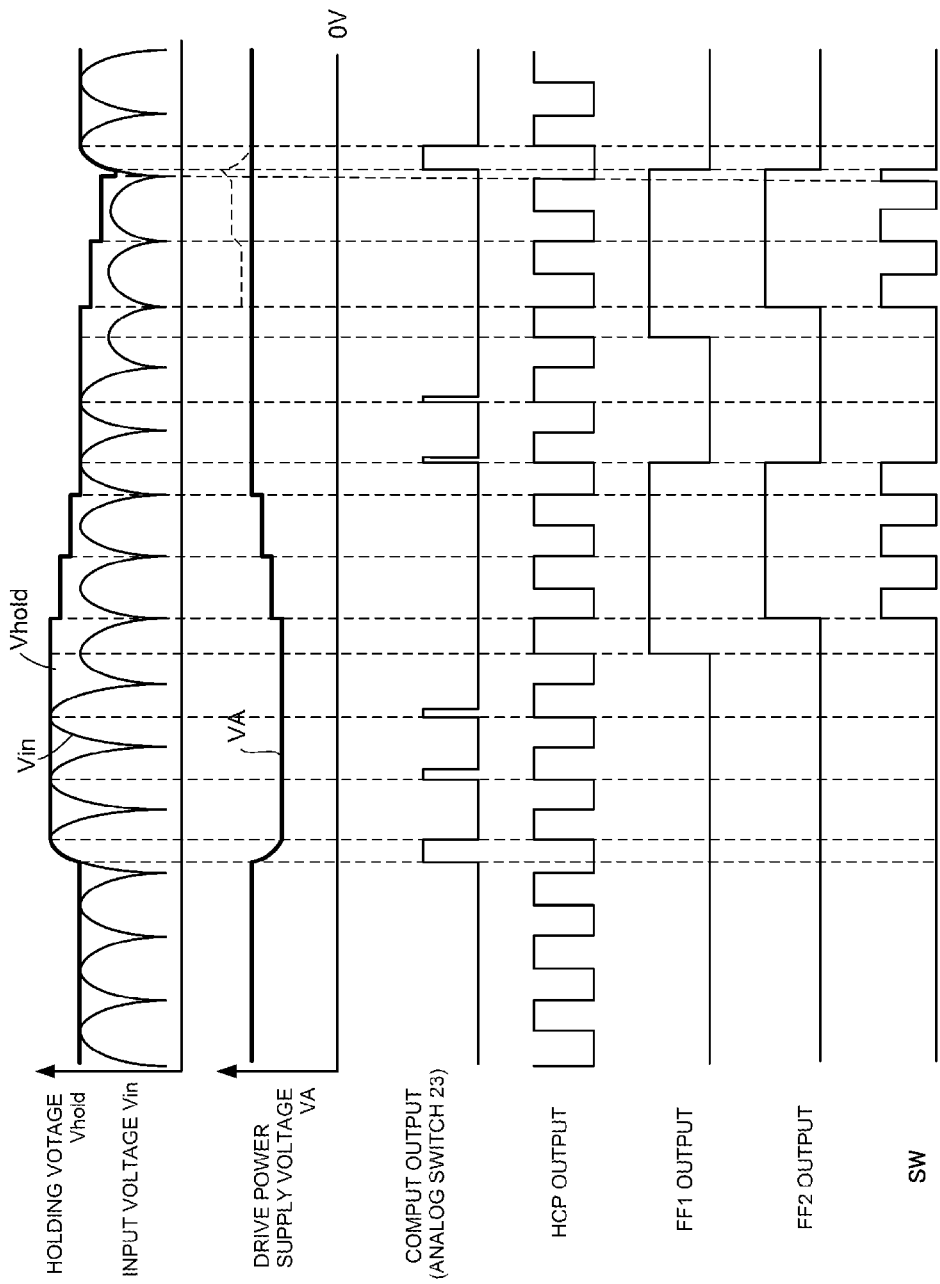
FIG. 5 is a diagram schematically showing an aspect of change in a drive power supply voltage VA with respect to change in the input voltage Vin in an internal power supply circuit of the drive circuit shown in FIG. 4.

Consequently, in a state wherein the holding voltage Vhold is higher than the input voltage Vin, as shown in FIG. 5, the output of the first stage flip-flop FF1 is set when a decrease in the input voltage Vin (negative change) is detected by the hysteresis comparator HCP. Further, the flip-flop FF1 is reset when the input voltage Vin reaches or exceeds the holding voltage Vhold. Also, the output of the second stage flip-flop FF2 is set when a rise in the input voltage Vin (positive change) is detected by the hysteresis comparator HCP in a state wherein the flip-flop FF1 is set. Further, the flip-flop FF2 is reset when the input voltage Vin reaches or exceeds the holding voltage Vhold.

Herein, the output of the second stage flip-flop FF2 is subjected to logical processing with the output of the NOT circuit N3 via a NOR circuit OR1. Further, the output of the NOR circuit OR1 is provided to a timer circuit T, to be described hereafter, and after being inverted via a NOT circuit N4, is provided to a second NOR circuit OR2. Further, the inverted output of the NOR circuit OR1 is subjected to logical processing with the output of the timer circuit T via the second NOR circuit OR2, and output via a NOT circuit N5 as a signal that drives the switch element SW so as to be turned on.

Herein, the timer circuit T, performing a role of causing the switch element SW to be turned on for a certain time, includes switch elements Q1 and Q2, controlled so as to be turned on and off in a complementary way by the output of the NOR circuit OR1, and a timer capacitor Ct that is charged and discharged via the switch elements Q1 and Q2. Further, the timer circuit T is configured so as to generate a pulse signal from the time when charging of the timer capacitor Ct starts until a certain time elapses by comparing the charging voltage of the timer capacitor Ct with a threshold voltage Vth using a comparator CPt. The output of the comparator CPt is provided via a NOT circuit N to the NOR circuit OR2.

Herein, the time for which the pulse signal is generated, that is, the timer circuit T output pulse width, is a time sufficiently short in comparison with the cycle of the input voltage Vin, and a time that causes the charging voltage of the capacitor C in the holding circuit 24 to decrease by a certain amount. Consequently, the signal generated via the NOT circuit N5 that drives the switch element SW so as to be turned on is a pulse signal corresponding to the time span of the pulse signal generated by the timer circuit T.

In this way, according to the internal power supply circuit 12 configured in the way heretofore described, when the input voltage Vin changes, the analog switch 23 is driven so as to be turned on every time the peak voltage of the input voltage Vin exceeds the holding voltage Vhold, as shown by the operation timing shown in FIG. 5. Further, the peak voltage of the input voltage Vin is held by the holding circuit 24 via the analog switch 23. Further, the holding voltage Vhold held by the holding circuit 24 is held until the switch element SW carries out a turn-on operation.

When the input voltage Vin decreases in this state, the flip-flops FF1 and FF2 are set in accordance with the polarity of a momentary change in the input voltage Vin detected by the hysteresis comparator HCP, and the timer circuit T is driven by the outputs of the flip-flops FF1 and FF2. Further, in synchronization with the cycle of change in the input voltage Vin, the switch element SW carries out a turn-on operation, the charge held in the capacitor C of the holding circuit 24 is released, and the holding voltage Vhold is reduced by a predetermined amount. When the holding voltage Vhold and the peak voltage of the input voltage Vin become momentarily equal as a result of the decrease in the holding voltage Vhold, there is no reduction in the holding voltage Vhold, as previously described.

Further, when the input voltage Vin exceeds the holding voltage Vhold, the input voltage Vin at that point is again held by the holding circuit 24 via the analog switch 23. Thereafter, the heretofore described change control of the holding voltage Vhold is repeatedly executed in response to fluctuation in the input voltage Vin. Further, the inversion amplification circuit 26, following change in the holding voltage Vhold, changes the drive power supply voltage VA that drives the output amplifier 11. That is, the inversion amplification circuit 26 reduces the drive power supply voltage VA when the input voltage Vin increases, and conversely, raises the drive power supply voltage VA when the input voltage Vin decreases.

Figure 6:
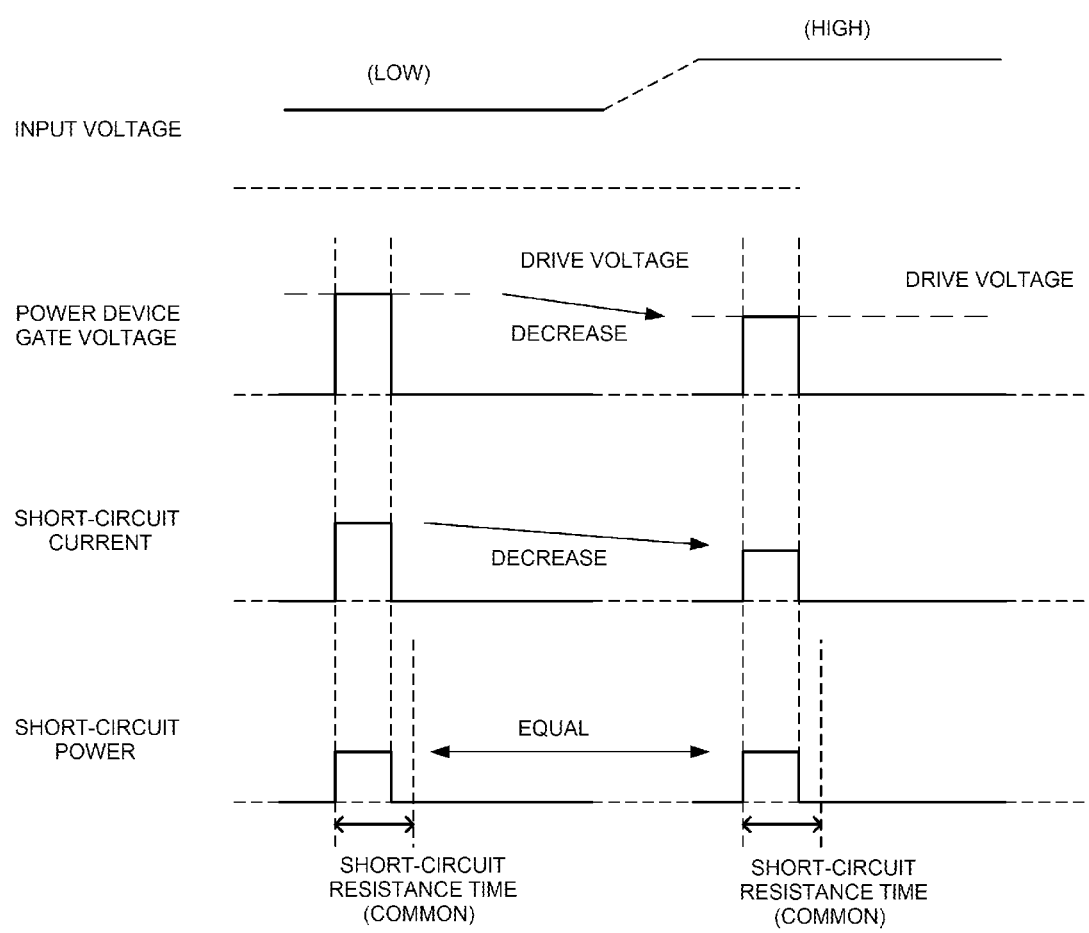
FIG. 6 is a diagram schematically showing aspects of change in the short-circuit current and short-circuit power in power devices when the input voltage Vin increases in a power converter according to the invention.

Consequently, according to the drive circuit 10 including the internal power supply circuit 12 according to the second embodiment, it is possible to achieve the same advantages as in the previous embodiment. That is, as seen by schematically showing in FIG. 6 aspects of change in the short-circuit current and short-circuit power in the power devices 1 and 2 when the input voltage Vin increases, it is possible to reduce the control voltage applied to the control terminals (gates) of the power devices 1 and 2 when the input voltage Vin rises. Further, it is possible to reduce the current flowing through the power devices 1 and 2 by the amount by which the control voltage is reduced.

As a result of this, even when there is a situation wherein short-circuit current flows through the power devices 1 and 2 in a state in which input voltage Vin higher than that at a normal time is being applied, it is possible to keep the short-circuit current small. Consequently, the short-circuit power dependent on the input voltage Vin and short-circuit current can be reduced in comparison with when driving using the existing drive circuits 3 and 4. Therefore, the short-circuit resistance required of the power devices 1 and 2 can be set low, in the same way as in the previous embodiment.

Herein, some observations will be added with regard to the short-circuit resistance required of the power devices 1 and 2 formed of IGBTs. Energy Esc of the short-circuit resistance of the power devices 1 and 2 is roughly proportional to a peak current Imax between the collector and emitter of the power devices 1 and 2, a voltage Vcc applied between the collector and emitter, and a short-circuit resistance time Tsc, and can be expressed as $$Esc = Imax \cdot Vcc \cdot Tsc.$$

The voltage Vcc applied between the collector and emitter of the power devices 1 and 2 corresponds to the input voltage Vin.

Meanwhile, the peak current Imax between the collector and emitter with respect to an IGBT gate voltage Vge, which is the control voltage of the power devices 1 and 2, can be expressed as $$Imax = a \cdot Vge - b \text{ (herein, } a \text{ and } b \text{ are constants)}.$$

Consequently, when focusing on the gate voltage Vge with respect to a specific power supply voltage Vcc applied between the collector and emitter of the power devices 1 and 2, it is possible to derive a relationship such that $$Vge = (1/a) \cdot (Esc/Tsc) \cdot (1/Vcc) + a/b$$

from the above expressions. Further, when assuming that the power supply voltage Vcc fluctuates in a range of 260V to 390V with a correlation coefficient of 0.9864, it is possible to obtain an approximate expression such that $$y = -0.0143x + 16.347$$

from the relationship.

Figure 7:
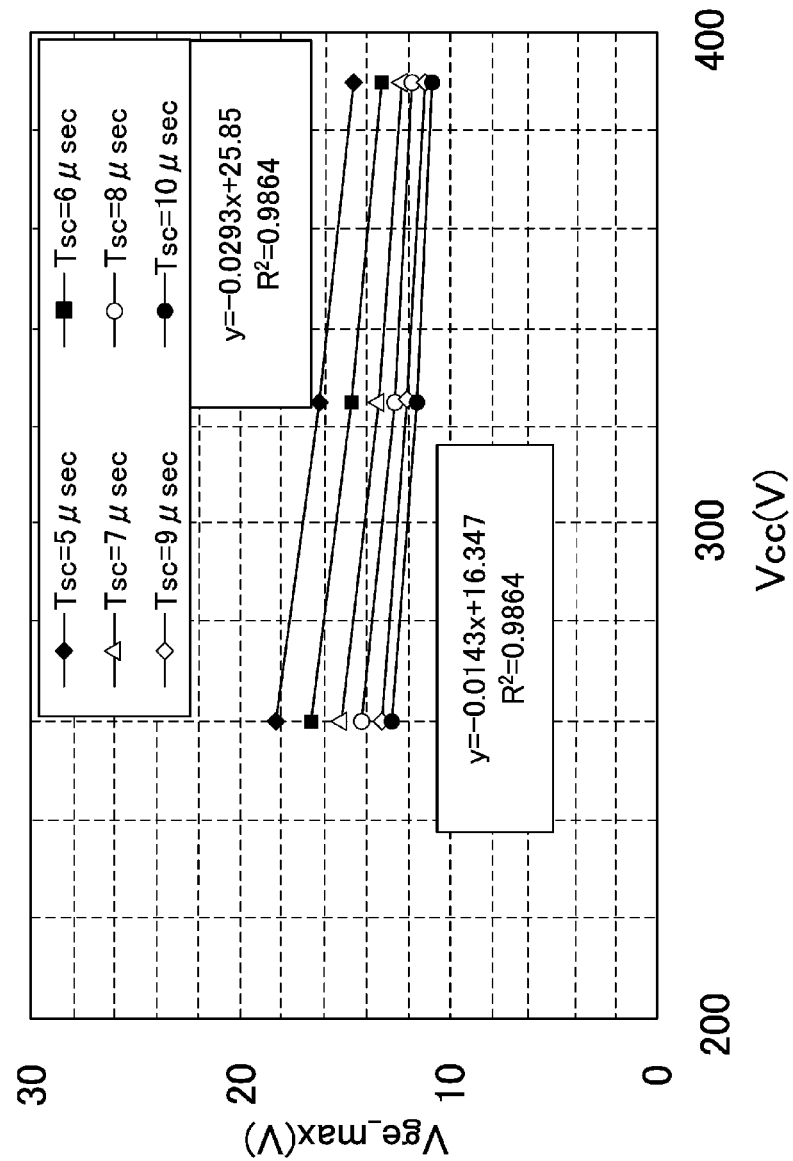
FIG. 7 is a diagram showing changes with respect to fluctuation in a power supply voltage Vcc of a maximum voltage Vge-max of gate voltage Vge that satisfies the short-current resistance.

With regard to this, when calculating changes with respect to fluctuation in the power supply voltage Vcc of a maximum voltage Vge-max of the gate voltage Vge that satisfies the short-current resistance, with the short-circuit resistance time Tsc as a parameter, the kinds of result shown in FIG. 7 are obtained. Further, each of the characteristics, when the correlation coefficient thereof is 0.9864 and when the power supply voltage Vcc fluctuates in a range of 260V to 390V, is shown in an approximate expression such that $$y = -0.0293x + 25.85.$$

Further, when comparing a displacement ΔVge of the gate voltage Vge with respect to a displacement ΔVcc of the power supply voltage Vcc, and a central value Vge-typ of the gate voltage Vge with respect to a central value Vcc-typ of the power supply voltage Vcc, it can be confirmed that the change characteristics thereof are extremely similar, and consequently, by causing the control voltage applied to the gates of the power devices 1 and 2 to change in accordance with the input voltage Vin applied to the power devices 1 and 2, as previously described, it is possible to keep constant the energy Esc of the short-circuit resistance of the power devices 1 and 2, despite fluctuation in the input voltage Vin. Therefore, it can be said that control by the previously described internal power supply circuit 12 is extremely effective.

The invention is not limited by the heretofore described embodiments. For example, when detecting the input voltage Vin, it is sufficient that the division ratio of the resistors Ra and Rb is in the region of 1/100. Also, it is also possible to amplify the output of the output buffer amplifier 25 using the inversion amplification circuit 26 with offset so as to satisfy the previously described approximate expressions, and adopt the output of the inversion amplification circuit 26 as the drive power supply voltage VA of the output amplifier 11. Also, the invention is also applicable in the same way when using MOSFETs as the power devices 1 and 2. Various other changes are possible, without departing from the scope of the invention.

REFERENCE SIGNS LIST

1, 2 Power device (IGBT)
3, 4 Drive circuit
5, 6 Freewheeling diode
7, 8 Output amplifier
10 Drive circuit
11 Output amplifier
12 Internal power supply circuit
21 Voltage detection means
22 Input buffer amplifier
23 Analog switch
24 Holding circuit
25 Output buffer amplifier
26 Inversion amplification circuit
27 Comparator circuit
28 Voltage holding control circuit
C Capacitor
COMP Comparator
SW Switch element
FF1, FF2 Flip-flop
T Timer circuit

The invention claimed is:

1. A power device drive circuit for driving a power device that switches input voltage so as to be turned on and off, the power device drive circuit comprising:
 an output amplifier that applies a control voltage to a control terminal of the power device in accordance with an on/off control signal, thereby driving the power device so as to be turned on and off; and
 an internal power supply circuit that generates a drive power supply voltage for the output amplifier in accordance with a change in the input voltage, thereby causing the control voltage to change based on a corresponding change in the input voltage and the drive power supply voltage,
 wherein the internal power supply circuit is configured to change the drive supply voltage output to the output amplifier based on a change in the input voltage, such that the internal power supply circuit reduces the drive power supply voltage of the output amplifier when the input voltage rises, thereby reducing the control voltage, and reducing the short-circuit current of the power device.

2. The power device drive circuit according to claim 1, wherein the power device is an IGBT or MOSFET.

3. The power device drive circuit according to claim 1, wherein the internal power supply circuit includes a comparator circuit that detects a rise in the input voltage, a holding circuit that holds the input voltage when a rise in the input voltage is detected by the comparator circuit, and an inversion amplification circuit that generates the drive power supply voltage for the output amplifier in accordance with the voltage held by the holding circuit.

4. The power device drive circuit according to claim 3, wherein the internal power supply circuit further includes a polarity detector that determines the polarity of a change in the input voltage, and a voltage holding control circuit that reduces the voltage held by the holding circuit in accordance with the output of the polarity detector.

5. The power device drive circuit according to claim 4, wherein:
the input voltage is voltage that is rectified alternating current voltage, and
the voltage holding control circuit reduces the voltage held by the holding circuit when the peak voltage of the input voltage decreases a predetermined consecutive number of times.

6. The power device drive circuit according to claim 1, wherein the power device is a first power device, and wherein a second power device is connected in series with the first power device between a power supply terminal and ground.

7. The power device drive circuit according to claim 1, wherein the internal power supply circuit is configured to cause the control voltage to decrease from a predetermined normal operating level based on an increase in the input voltage, and to cause the control voltage to remain unchanged from the predetermined normal operating level based on a decrease in the input voltage.

8. A power device drive circuit for driving a power device that switches input voltage so as to be turned on and off, the power device drive circuit comprising:
an output amplifier that applies a control voltage to a control terminal of the power device in accordance with an on/off control signal, thereby driving the power device so as to be turned on and off; and
an internal power supply circuit that generates a drive power supply voltage for the output amplifier in accordance with a change in the input voltage, thereby causing the control voltage to change based on a corresponding change in the input voltage and the drive power supply voltage,
wherein the internal power supply circuit includes a comparator circuit that detects a rise in the input voltage, a holding circuit that holds the input voltage when a rise in the input voltage is detected by the comparator circuit, and an inversion amplification circuit that generates the drive power supply voltage for the output amplifier in accordance with the voltage held by the holding circuit.

9. The power device drive circuit according to claim 8, wherein the internal power supply circuit further includes a polarity detector that determines the polarity of a change in the input voltage, and a voltage holding control circuit that reduces the voltage held by the holding circuit in accordance with the output of the polarity detector.

10. The power device drive circuit according to claim 9, wherein:
the input voltage is voltage that is rectified alternating current voltage, and
the voltage holding control circuit reduces the voltage held by the holding circuit when the peak voltage of the input voltage decreases a predetermined consecutive number of times.

11. The power device drive circuit according to claim 8, wherein the power device is a first power device, and wherein a second power device is connected in series with the first power device between a power supply terminal and ground.

12. The power device drive circuit according to claim 8, wherein the internal power supply circuit is configured to cause the control voltage to decrease from a predetermined normal operating level based on an increase in the input voltage, and to cause the control voltage to remain unchanged from the predetermined normal operating level based on a decrease in the input voltage.

13. A power device drive circuit for driving a power device that switches input voltage so as to be turned on and off, the power device drive circuit comprising:
an output amplifier that applies a control voltage to a control terminal of the power device in accordance with an on/off control signal, thereby driving the power device so as to be turned on and off; and
an internal power supply circuit that generates a drive power supply voltage for the output amplifier in accordance with a change in the input voltage, thereby causing the control voltage to change based on a corresponding change in the input voltage and the drive power supply voltage,
wherein the internal power supply circuit is configured to cause the control voltage to decrease from a predetermined normal operating level based on an increase in the input voltage, and to cause the control voltage to remain unchanged from the predetermined normal operating level based on a decrease in the input voltage.

14. The power device drive circuit according to claim 13, wherein the internal power supply circuit includes a comparator circuit that detects a rise in the input voltage, a holding circuit that holds the input voltage when a rise in the input voltage is detected by the comparator circuit, and an inversion amplification circuit that generates the drive power supply voltage for the output amplifier in accordance with the voltage held by the holding circuit.

15. The power device drive circuit according to claim 14, wherein the internal power supply circuit further includes a polarity detector that determines the polarity of a change in the input voltage, and a voltage holding control circuit that reduces the voltage held by the holding circuit in accordance with the output of the polarity detector.

16. The power device drive circuit according to claim 15, wherein:
the input voltage is voltage that is rectified alternating current voltage, and
the voltage holding control circuit reduces the voltage held by the holding circuit when the peak voltage of the input voltage decreases a predetermined consecutive number of times.

17. The power device drive circuit according to claim 13, wherein the power device is a first power device, and wherein a second power device is connected in series with the first power device between a power supply terminal and ground.

* * * * *